(12) United States Patent
Lim et al.

(10) Patent No.: US 11,462,488 B2
(45) Date of Patent: Oct. 4, 2022

(54) SUBSTRATE CORES FOR WARPAGE CONTROL

(71) Applicant: Intel Corporation, Santa Clara, CA (US)

(72) Inventors: Seok Ling Lim, Kulim Kedah (MY); Bok Eng Cheah, Pinang (MY); Jackson Chung Peng Kong, Pinang (MY); Jenny Shio Yin Ong, Pinang (MY)

(73) Assignee: Intel Corporation, Santa Clara, CA (US)

(*) Notice: Subject to any disclaimer, the term of this patent is extended or adjusted under 35 U.S.C. 154(b) by 0 days.

(21) Appl. No.: 17/090,926

(22) Filed: Nov. 6, 2020

(65) Prior Publication Data

US 2022/0068843 A1    Mar. 3, 2022

(30) Foreign Application Priority Data

Sep. 3, 2020  (MY) ............................ PI2020004578

(51) Int. Cl.
| | |
|---|---|
| *H01L 23/00* | (2006.01) |
| *H01L 23/14* | (2006.01) |
| *H01L 21/48* | (2006.01) |
| *H01L 23/498* | (2006.01) |
| *H01L 23/16* | (2006.01) |

(52) U.S. Cl.
CPC .......... *H01L 23/562* (2013.01); *H01L 21/486* (2013.01); *H01L 23/14* (2013.01); *H01L 23/16* (2013.01); *H01L 23/49827* (2013.01); *H01L 23/49838* (2013.01)

(58) Field of Classification Search
CPC ........................... H01L 23/562; H01L 21/486
See application file for complete search history.

(56) References Cited

U.S. PATENT DOCUMENTS

| | | | | |
|---|---|---|---|---|
| 2020/0358163 | A1* | 11/2020 | See ........................ | H05K 1/185 |
| 2021/0005542 | A1* | 1/2021 | Mallik .................... | H01L 24/92 |
| 2021/0280518 | A1* | 9/2021 | Xie ........................ | H01L 24/16 |
| 2021/0375829 | A1* | 12/2021 | Or-Bach ............... | H01L 23/473 |
| 2022/0013485 | A1* | 1/2022 | Or-Bach ................ | H01L 21/78 |

* cited by examiner

*Primary Examiner* — Thao P Le
(74) *Attorney, Agent, or Firm* — Viering, Jentschura & Partner MBB (57) ABSTRACT

According to the various aspects, a package substrate with a heterogeneous substrate core including a first core layer that is coextensive with the package substrate and extends through a first section and a second section of the substrate core, in which the first section is adjacent to and thicker than the second section. The first section having at least a second layer and/or a third layer to provide the difference in thickness with the second section.

16 Claims, 11 Drawing Sheets

SUBSTRATE CORES FOR WARPAGE CONTROL

CROSS-REFERENCE TO RELATED APPLICATIONS

This non-provisional application claims priority to Malaysian Patent Application No. PI2020004578, which was filed on Sep. 3, 2020, which is incorporated by reference herein in its entirety.

BACKGROUND

The trend for the next generation 2.5D/3D stacked die packages and package-on-package solutions is to reduce vertical heights (i.e., z-height). Increasingly thin substrates are being used in package designs to meet the overall package thickness specification. As package substrates become thinner, by necessity, substrate cores have been reduced in thickness as well. The main purpose of substrate cores is to add rigidity to package substrates and reducing their thickness can be counterproductive. Therefore, one of the main challenges for thin package substrates is warpage control because the warpage tends to increase as the package substrates become thinner.

In particular, the package warpage poses significant challenges to manufacturing 2.5D or 3D stacked die packages and for their package-to-printed circuit board (PCB) interconnect reliability. The stability of a package substrate can be affected by the thermal conditions of the various package assembly processes and may cause a variance in the end-of-the-line package warpage that is significant enough to push some packages out of a typical 80 um warpage specification tolerance.

The current solutions to mitigate package warpage include increasing ball grid array (BGA) geometry (i.e., greater BGA diameter and/or pitch distance), increasing package substrate core thickness, and using a package stiffener on a package substrate (i.e., a metal/molded frame). These solutions may require a package substrate footprint expansion due to the increased BGA geometry and/or interconnect pitch, an increased z-height for the package substrate core that may affect electrical performance or additional space associated with adding a stiffener to a package substrate for warpage control, which may not facilitate the package substrates becoming thinner.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the present disclosure. The dimensions of the various features or elements may be arbitrarily expanded or reduced for clarity. In the following description, various aspects of the present disclosure are described with reference to the following drawings, in which.

DETAILED DESCRIPTION

The following detailed description refers to the accompanying drawings that show, by way of illustration, specific details and aspects in which the present disclosure may be practiced. These aspects are described in sufficient detail to enable those skilled in the art to practice the present disclosure. Various aspects are provided for devices, and various aspects are provided for methods. It will be understood that the basic properties of the devices also hold for the methods and vice versa. Other aspects may be utilized and structural, and logical changes may be made without departing from the scope of the present disclosure. The various aspects are not necessarily mutually exclusive, as some aspects can be combined with one or more other aspects to form new aspects.

According to the present disclosure, a package substrate may have a heterogeneous substrate core including a first core layer that is generally coextensive with the package substrate and extends through a first core section and a second core section of the heterogeneous substrate core, in which the first core section may be adjacent to and thicker than the second core section. The first core section may have at least a second layer and/or a third layer to provide at least one difference in thickness with the second core section, which may consist of only the first core layer. The use of different dimensions and positioning for the second and third core layers on the first core layer permits the package substrate to be "tunable" in controlling the warpage of a package substrate.

The technical advantages of the present disclosure include, without limitation, the following: (1) unique heterogeneous substrate cores that provide improved warpage control for package substrates resulting in package assembly yield improvements; and (2) improved device reliability from improved warpage control through reduced mechanical stresses on solder joint interconnects during the heating operations used in manufacturing and assembling semiconductor packages.

Figure 1:
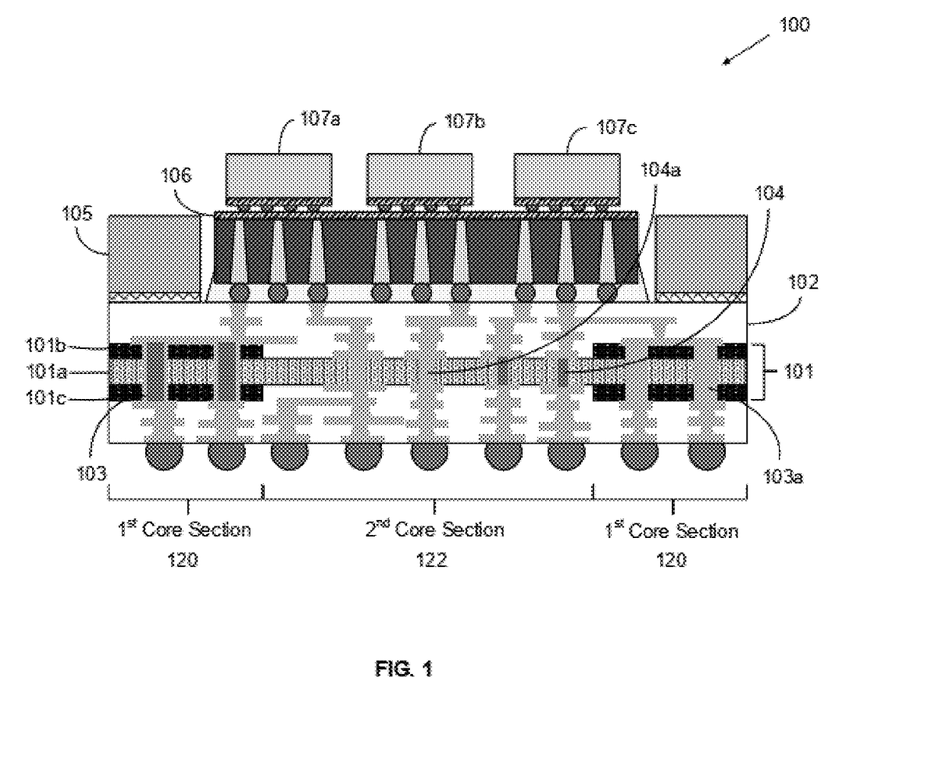
FIG. 1 shows an exemplary semiconductor package with a heterogeneous substrate core, as a cross-sectional view of a semiconductor package shown in FIG. 1A or 1B along an A-A' section line, according to an aspect of the present disclosure.
Figure 1A:
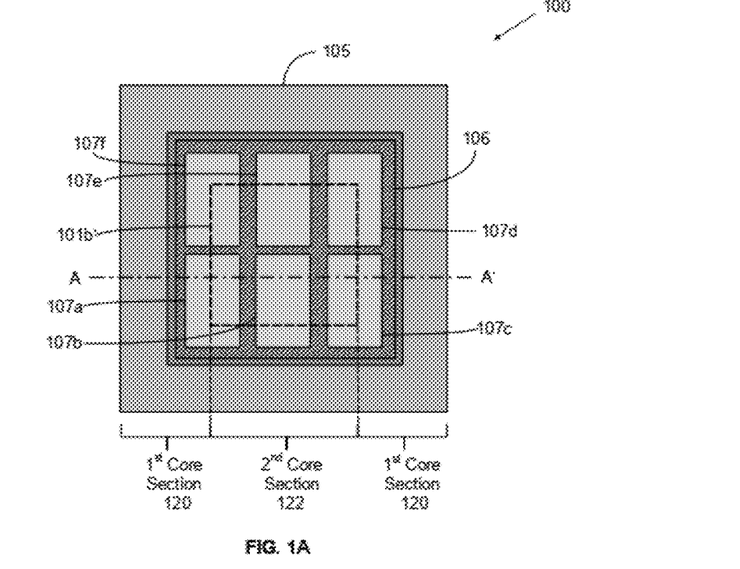
FIG. 1A shows a top view of the semiconductor package shown in FIG. 1.
Figure 1B:
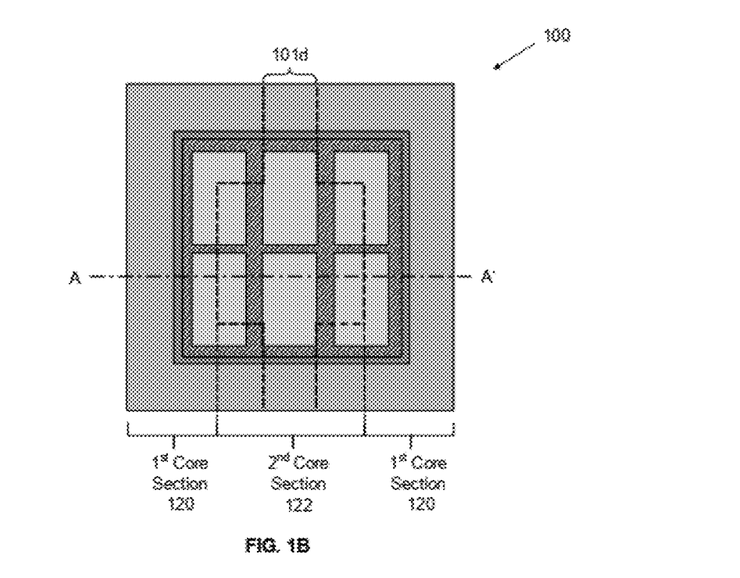
FIG. 1B shows an alternative top view of the semiconductor package shown in FIG. 1.

According to an aspect of the present disclosure as shown in FIG. 1, which may be a cross-sectional view along an A-A' section line of a semiconductor package shown in FIG. 1A or FIG. 1B, an exemplary semiconductor package 100 includes a package substrate 102 with a heterogeneous substrate core 101. In this aspect, the heterogeneous substrate core 101 may have a first core layer 101a with a top and bottom surface, and a second core layer 101b on the top surface and a third core layer 101c on the bottom surface of the first core layer 101a. In an aspect, a $1^{st}$ core section 120 of the heterogeneous substrate core may have a first core layer 101a and includes a second core layer 101b and/or a third core layer 101c, and on the other hand, a $2^{nd}$ core section 122 may have a first core layer only, without any second or third core layers. In an aspect, the $1^{st}$ core section 120 may have a thickness in the range of 200 to 500 μm and the $2^{nd}$ core section 122 may have a thickness in the range of 100 to 300 μm.

According to the present disclosure, a "heterogeneous" substrate core may have different thicknesses that may vary by location and may use different materials for the first, second, and third core layers to provide highly tunable warpage control for a package substrate.

In an aspect, the $1^{st}$ core section 120 of the heterogeneous substrate core 101 may include a plurality of first plated through hole vias 103 and 103a having a first length and the $2^{nd}$ core section 122 of the heterogeneous substrate core 101 may include a plurality of second plated through hole vias 104 and 104a having a second length shorter than the first length. In another aspect, the first plated through hole vias 103 and the second plated through hole vias 104 may be filled in their center portions with a non-conductive material, for example, an epoxy polymer layer, whereas the first plated through hole vias 103a and the second plated through hole vias 104a may be a fully plated through hole via. It is typical to have all of the plated through holes vias for a package substrate be either non-conductive center-filled plated through hole vias or fully plated through hole vias.

In another aspect, the plurality of first plated through hole vias 103, 103a and the plurality of second plated through hole vias 104, 104a may be configured to facilitate signal transmission, reference voltage and/or power supply connection between a plurality of chiplets and one or more electronic components or transceiver devices on the PCB.

In another aspect, a stiffener 105 may be attached to package substrate 102 to provide additional rigidity, and an interposer 106, with semiconductor devices 107a, 107b, and 107c, as well as other devices, may be coupled to the package substrate 102 to form the semiconductor package 100, according to the present disclosure.

In FIG. 1A, a top view is shown for the semiconductor package 100 in FIG. 1 according to the present disclosure. In this aspect, the $1^{st}$ core section 120 may form a "frame" that surrounds the $2^{nd}$ core section 122, which may be located at a central portion of the semiconductor package 100 and is shown by a dashed line 101b' representing an inner side edge for the $2^{nd}$ core layer 101b. The stiffener 105 may also form a frame that surrounds the interposer 106, which may have a plurality of semiconductor devices 107a, 107b, and 107c and an additional semiconductor devices 107d, 107e, and 107f coupled thereon.

In an aspect, the plurality of semiconductor devices may be, for example, a central processing unit (CPU) core, a graphic processing unit (GPU), a memory device, a platform controller hub (PCH)/chipset, a field programmable gate array (FPGA) or input/output (I/O) tiles. In another aspect, the $2^{nd}$ core section 122 may have a footprint that is beneath the plurality of semiconductor devices.

FIG. 1B shows an alternative top view for the semiconductor package 100 in FIG. 1. In this aspect, there are gaps 101d in the periphery of the $1^{st}$ core section 120, such that it does not completely surround the $2^{nd}$ core section 122, and may form two $1^{st}$ core sections. It is within the scope of the present disclosure to have a $1^{st}$ core section and/or a $2^{nd}$ core section be segmented as needed to provide warpage control for a semiconductor package. It is within the scope of the present disclosure to have a second core layer and/or a third core layer be segmented as needed to provide warpage control for a semiconductor package.

Figure 2:
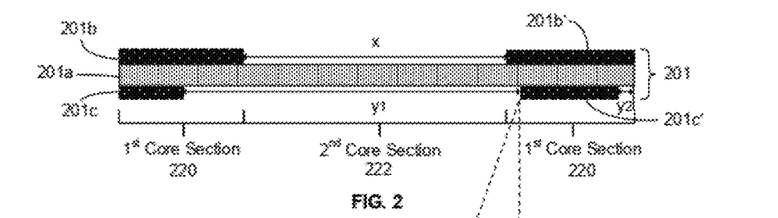
FIG. 2 shows an exemplary heterogeneous substrate core according to an aspect of the present disclosure.

FIG. 2 shows an exemplary heterogeneous substrate core 201 according to an aspect of the present disclosure. As shown in FIG. 2, a second core layer 201b may have outer side edges that are aligned with the outer side edges of a first core layer 201a and may have a separation x with its segment 201b' to define a $2^{nd}$ core section 222. In an aspect, the segment 201b' may be part of the second core layer 201b forming a frame around the $2^{nd}$ core section 222. In this aspect, a third core layer 201c may have a segment 201c' and may have different width dimensions and may be positioned differently with respect to their alignment with the outer side edges of for the first core layer 201a. In an aspect, the segment 201c' may be part of the third core layer 201c forming a frame around the $2^{nd}$ core section 222.

In particular, according to the present disclosure, the third core layer 201c may have an outer side edge aligned with outer side edges of the first core layer 201a and the second core layer 201b, and may have an inner side edge with a separation $y_1$ from an inner side edge of its segment 201c'. In addition, the segment 201c' may be center-aligned with the second core layer 201b' and may have an outer side edge that is separated by a distance $y_2$ from the aligned outer side edges of the first core layer 201a and the second core layer 201b'.

Figure 2A:
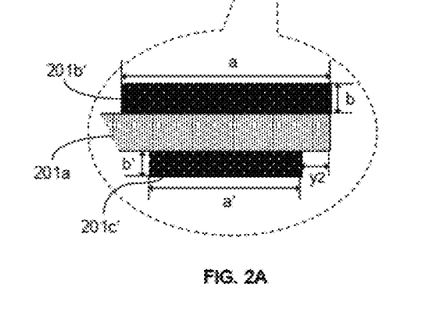
FIG. 2A shows an expanded view of an aspect of the exemplary heterogeneous substrate core shown in FIG. 2.

As shown in FIG. 2A, an aspect of the $1^{st}$ core section 220 of FIG. 2 is expanded. In this aspect, a representative width dimension "a" and thickness dimension "b" are shown for the second core layer 201b', and a representative width dimension "a'" and thickness dimension "b'" are shown for the third core layer 201c'. In an aspect, the width dimensions a and a' may range from 100 μm to 2 mm. In another aspect, the width a' may be smaller than the width a by approximately 20 to 50 percent. In an aspect, the thickness dimensions b and b' may range from 20 μm to 100 μm. In another aspect, the thickness dimension b' may be smaller than the thickness dimension b by approximately 20 to 50 percent. It should be understood that the positions and dimensions for the second core layer 201b and the third core layer 201c may be switched depending on the tuning of the warpage control for a package substrate.

According to aspects of the present disclosure, a first core layer may be made of a thermoset material, e.g., bismaleimide-triazine resin or a glass-reinforced epoxy laminate. In another aspect, a second core layer may be made of an organic material similar to the first core layer or an inorganic material, e.g., a silicon substrate core or a glass core layer. In a further aspect, a third core layer may be made of an organic material similar to the first core layer or an inorganic material, e.g., a silicon substrate core or a glass core layer, similar to the second core layer. In an aspect, a heterogeneous substrate core may include an adhesive layer between a first core layer and a second core layer and/or between the first core layer and a third core layer for improved strength.

Figure 3:
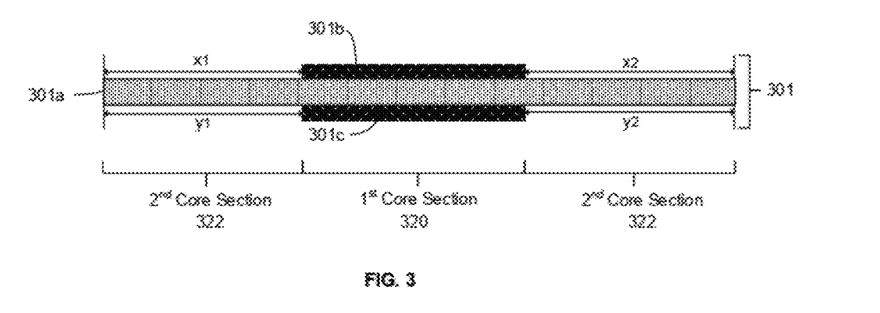
FIG. 3 shows an exemplary heterogeneous substrate core according to another aspect of the present disclosure.

FIG. 3 shows an exemplary heterogeneous substrate core 301 according to another aspect of the present disclosure. As shown in FIG. 3, a second core layer 301b and a third core layer 301c may be positioned near a central portion of a first layer 301a to form a $1^{st}$ core section 320 and a $2^{nd}$ core section 322. The position of the second core layer 301b may be defined by dimensions $x_1$ and $x_2$, and the position of the third core layer 301c may be defined by dimensions $y_1$ and $y_2$, as shown in FIG. 3.

Figure 4:
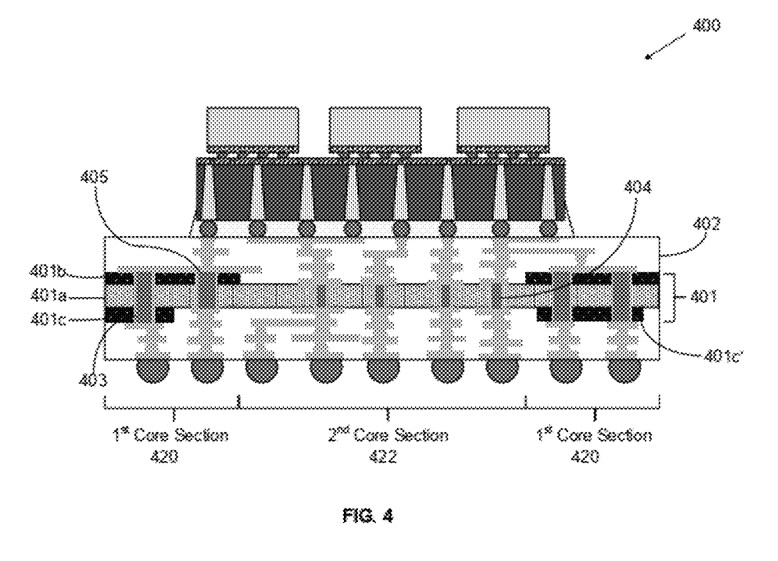
FIG. 4 shows an exemplary semiconductor package with another heterogeneous substrate core according to an aspect of the present disclosure.

FIG. 4 shows an exemplary semiconductor package 400 including a heterogeneous substrate core 401 formed in a package substrate 402 according to an aspect of the present disclosure. In this aspect, the heterogeneous substrate core 401, which may be similar to that shown in FIG. 2, includes a second core layer 401b that may have outer side edges that are aligned with the outer side edges of first core layer 401a, and a third core layer 401c may have one of its outer side edges aligned with outer side edges of the first core layer 401a and second core layer 401b and may have its segment 401c' with an outer side edge that may not be aligned with another outer side edge of first core layer 401a.

In an aspect, a $1^{st}$ core section 420 of the heterogeneous substrate core 401 may include a first plated through hole vias 403 having a first length and a $2^{nd}$ core section 422 of the heterogeneous substrate core 401 may include a second plated through hole vias 404 having a second length that is shorter than the first length. In another aspect, the $1^{st}$ core section 420 of the heterogeneous substrate core 401 may include a third plated through hole via 405 extending through the first core layer 401a and the second core layer 401b having a third length that is greater than the second length but shorter than the first length.

In another aspect, a stiffener may be optionally added, if needed, to package substrate 402 to provide additional rigidity for warpage control.

Figure 5:
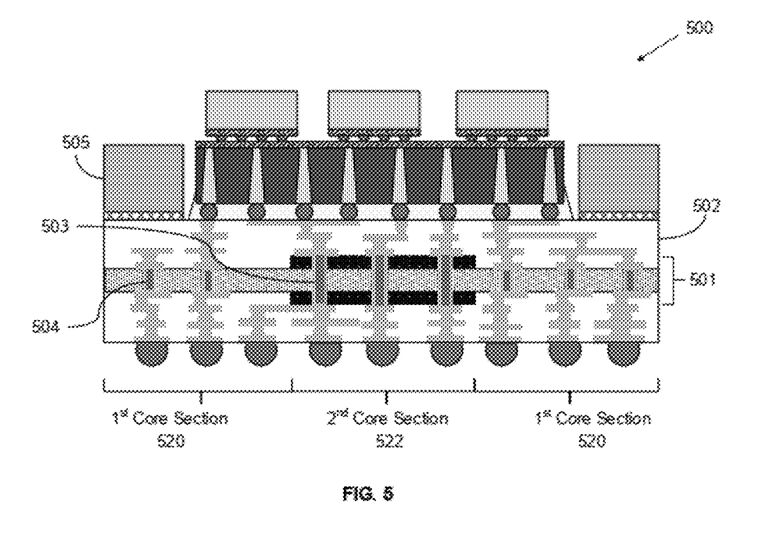
FIG. 5 shows an exemplary semiconductor package with yet another heterogeneous substrate core according to an aspect of the present disclosure.

FIG. 5 shows an exemplary semiconductor package 500 including a heterogeneous substrate core 501 formed in a package substrate 502 according to an aspect of the present disclosure. In this aspect, the heterogeneous substrate core 501, which may be similar to that shown in FIG. 3, includes a second core layer and a third core layer positioned near a central portion of a first layer forming a $1^{st}$ core section 520. In this aspect, a $2^{nd}$ core section 522 may frame or partially frame the $1^{st}$ core section 520 in the package substrate 502.

In an aspect, the 1st core section 520 of the heterogeneous substrate core 501 may include a first plated through hole vias 503 having a first length and a 2nd core section of the heterogeneous substrate core 501 may include a second plated through hole vias 504 having a second length that is shorter than the first length. In another aspect, a stiffener 505 may be added to package substrate 502 to provide rigidity along a periphery of the package substrate 502.

Figure 6:
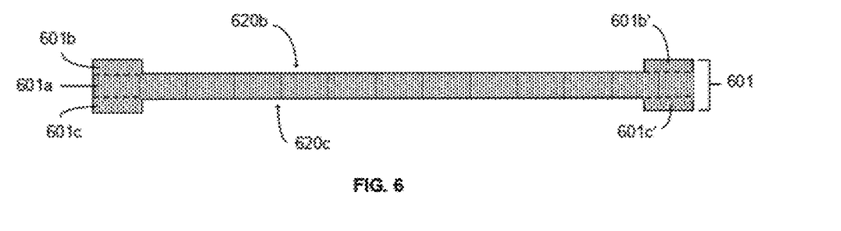
FIG. 6 shows an exemplary heterogeneous substrate core according to another aspect of the present disclosure.

FIG. 6 shows an exemplary heterogeneous substrate core 601 according to another aspect of the present disclosure. In this aspect, the heterogeneous substrate 601 core may include a second core layer 601b and a third core layer 601c that are "integral" core layers, i.e., formed by adding more of the same material as a first core layer 601a and/or formed by removing material from a larger layer of material. As shown in FIG. 6, the integral second core layer 601b may have a recess 620b that forms a segment 601b' and the integral third core layer 601c may have recess 620c that forms a segment 601c'.

Figure 7:
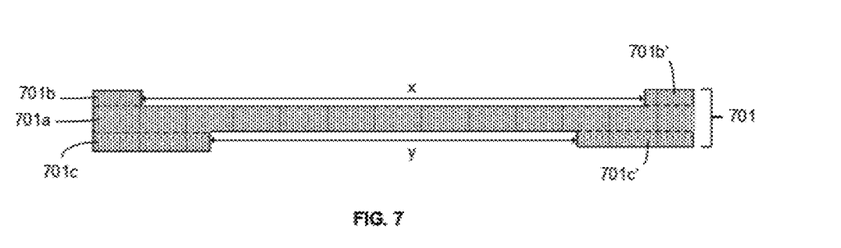
FIG. 7 shows an exemplary heterogeneous substrate core according to yet another aspect of the present disclosure.

FIG. 7 shows an exemplary heterogeneous substrate core 701 according to yet another aspect of the present disclosure.

As shown in FIG. 7, an integral second core layer 701b may be separate by a dimension x from its segment 701b' and an integral third core layer 701c may be separate by a dimension y from its segment 701c'. In this aspect, the dimension x may be larger than dimension y, but these dimensions may be modified as needed.

Figure 8:
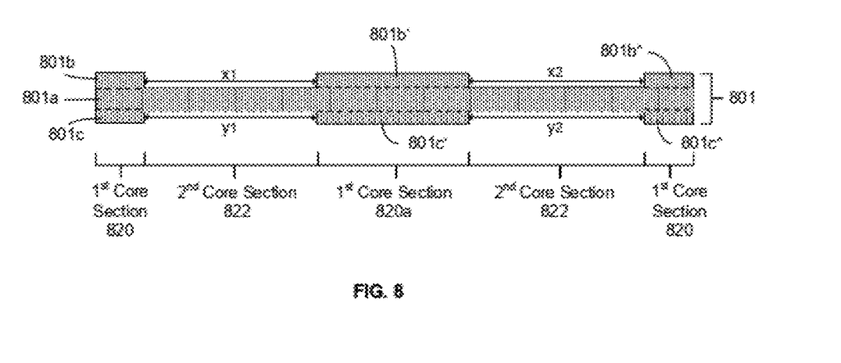
FIG. 8 shows an exemplary heterogeneous substrate core according to a further aspect of the present disclosure.

FIG. 8 shows an exemplary heterogeneous substrate core 801 according to yet another aspect of the present disclosure. As shown in FIG. 8, heterogeneous substrate core 801 may have a plurality of $1^{st}$ core sections 820, 802a and $2^{nd}$ core sections 822. In this aspect, an integral second core layer 801b may be separate by a dimension $x_1$ from its segment 801b', which in turn may be separated by a dimension $x_2$ from its further segment 801b'', and an integral third core layer 801c may be separate by a dimension $y_1$ from its segment 801c', which in turn may be separated by a dimension $y_2$ from its further segment 801c''. It should be understood that the dimensions for the dimensions $x_1$, $x_2$, $y_1$, and $y_2$ for the integral second and third core layers, respectively, may be pre-determined based on the tuning of the warpage control for a package substrate (not shown).

It is within the scope of the present disclosure to have a heterogeneous substrate core with an integral second core layer only or an integral third layer only. It is also within the scope of the present disclosure to have a heterogeneous substrate core with an integral second core layer and an integral third core layer with identical dimensions as compared to a heterogeneous substrate core with an attached second core layer and an attached third core layer. It is further within the scope of the present disclosure to combine an integral second core layer with an attached third core layer or vice versa.

Figure 9:
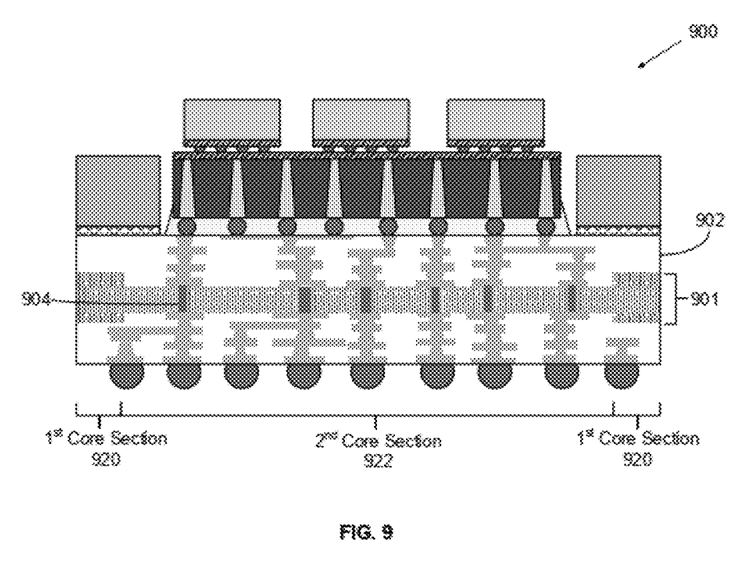
FIG. 9 shows an exemplary semiconductor package with yet another heterogeneous substrate core according to an aspect of the present disclosure.

FIG. 9 shows an exemplary semiconductor package 900 including a heterogeneous substrate core 901 formed in a package substrate 902 according to an aspect of the present disclosure. In this aspect, the heterogeneous substrate core 901, which may be similar to that shown in FIG. 6, includes a $1^{st}$ core section 920 formed by a first, a second, and a third core layers and may be positioned proximal to the periphery of the package substrate 902. In this aspect, the $1^{st}$ core section 920 may frame or partially frame a $2^{nd}$ core section 922 in a central portion of a package substrate 902. In yet another aspect, the $2^{nd}$ core section 922 of the heterogeneous substrate core 901 may include plated through hole vias 904, while the $1^{st}$ core sections 920 may have no plated through hole vias therein.

FIGS. 10A through 10H show an exemplary process for forming aspects of a heterogeneous substrate core 1001 for a package substrate 1002 according to the present disclosure.

Figure 10A:
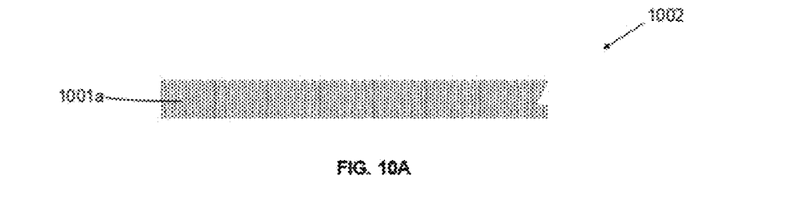
FIGS. 10A through 10H show an exemplary process for forming aspects of a heterogeneous substrate core according to the present disclosure.

FIG. 10A shows a first core 1001a that provides a starting foundation for forming the package substrate 1002.

Figure 10B:
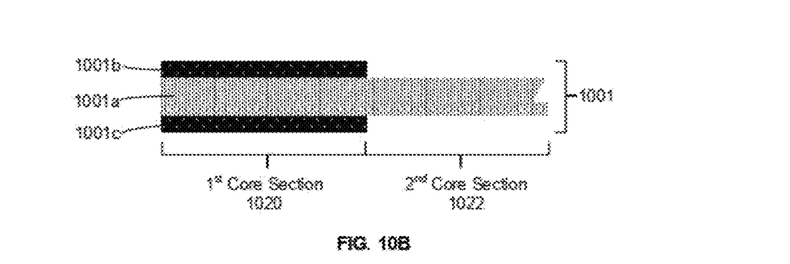

FIG. 10B shows a second core layer 1001b and a third core layer 1001c attached to the first core layer 1001a to form a $1^{st}$ core section 1020 and a $2^{nd}$ core section 1022 of the heterogeneous substrate 1001 according to the present disclosure. In an aspect, the second core layer 1001b and the third core layer 1001c may be formed on the first core layer 1001a through a molding process, for example, a transfer molding, an injection molding or a compression molding process. In an aspect, the second core layer 1001b and the third core layer 1001c may be separately formed and then attached by, for example, a standard lamination and hot-press process.

In another aspect, the second core layer 1001b and/or the third core layer 1001c may be attached to the first core layer 1001a through an adhesive layer (not shown). It should be understood that the positions of a second and/or a third core layer, as shown in the figures or as otherwise, may be determined in accordance with the present disclosure, and the positions of the $1^{st}$ and $2^{nd}$ core sections may vary as determined by the positions of the second and third core layers.

Figure 10C:
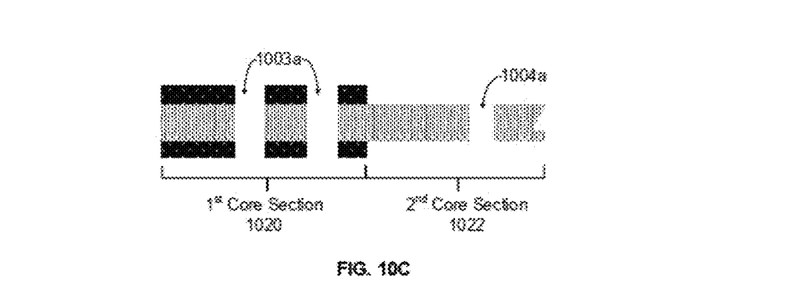

FIG. 10C shows the removal of portions of the $1^{st}$ and $2^{nd}$ core sections 1020 and 1022, respectively, to form openings for plated through hole vias. In an aspect, openings 1003a and 1004a may be formed by, for example, a mechanical and/or laser drilling process. In an aspect, the openings 1003a may have a first diameter, and the openings 1004a may have a second diameter, and the first diameter may be larger than the second diameter by, for example, 10 to 30 percent.

Figure 10D:
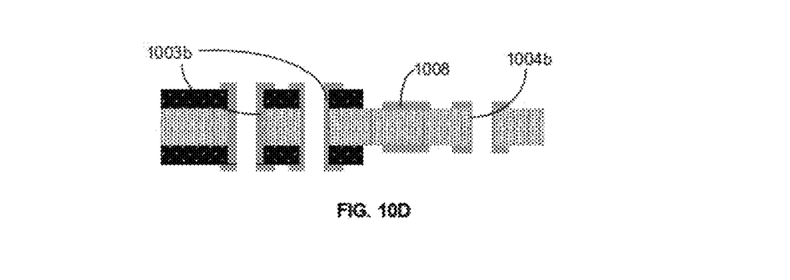

FIG. 10D shows a deposited conductive material, e.g., copper, on sidewalls of the via openings to form layers 1003b and layers 1004b, along with contact pads 1008 and contact pads around the via openings to connect with layers 1003b and 1004b. In an aspect, the conductive sidewall layers 1003b and 1004b, and the contact pad 1008 and other contact pads, may be formed by, for example, a standard electroless plating and/or electrolytic plating process.

Figures 10E, 10F:
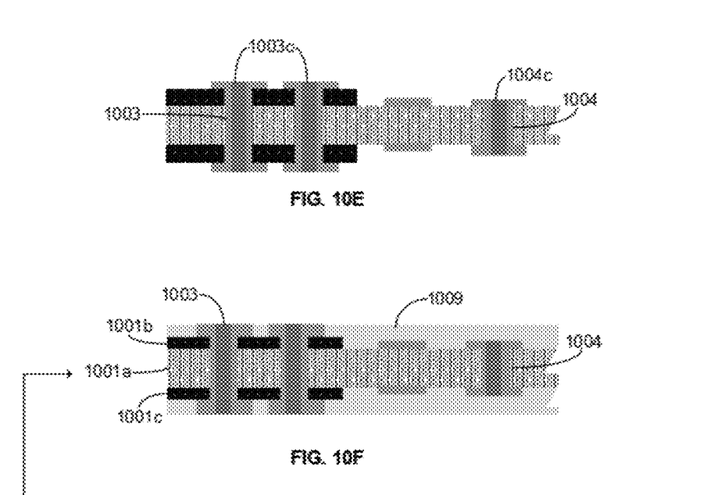

FIG. 10E shows plated through hole vias 1003 and 1004 filled in their center portions with a dielectric material 1003c and 1004c, respectively, by, for example, a standard screen printing process. In an aspect, the dielectric material 1003c and 1004c may include an epoxy resin material. In another aspect, the plated through hole vias 1003 and/or 1004 may be filled with a conductive material, e.g., a copper layer 1003d for improved current carrying capacity.

FIG. 10F shows a dielectric material 1009 deposited on the heterogeneous substrate core 1001 after a leveling process is performed on its top and bottom surfaces. In an aspect, the dielectric material 1009 may be deposited by, for example, a standard deposition process or a hot press lamination process followed by, for example, an optional standard grinding process, such as mechanical polishing.

Figure 10G:
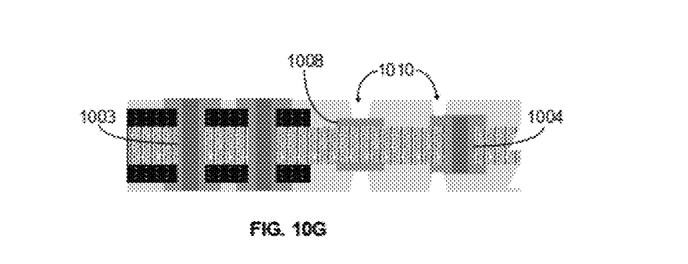

FIG. 10G shows micro-via openings 1010 formed to expose the contact pads on the heterogeneous substrate core 1001. In an aspect, the micro-via openings 1010 may be formed by, for example, a laser drilling process. In an aspect, the micro-via openings 1010 may include a fourth diameter that is smaller than the second diameter of the openings 1004a.

Figure 10H:
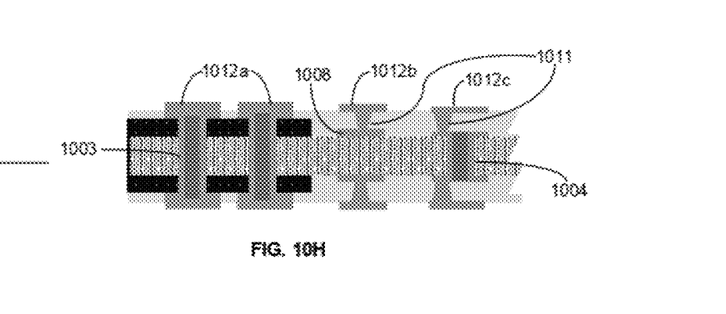

FIG. 10H shows micro-vias 1011 and contact pads 1012a, 1012b, and 1012c formed to provide connections to the plated through hole vias 1003 and/or 1004. In an aspect, the micro-vias 1011 and contact pads 1012a, 1012b, and 1012c may be formed by, for example, a standard electroless plating, an electrolytic plating and/or an etching process.

To complete the package substrate 1002, the processes discussed with respect to FIGS. 10F through 10H may be repeated as many times as needed to achieve a desired build-up layer count by adding level interconnects and micro-vias.

Figure 11A:
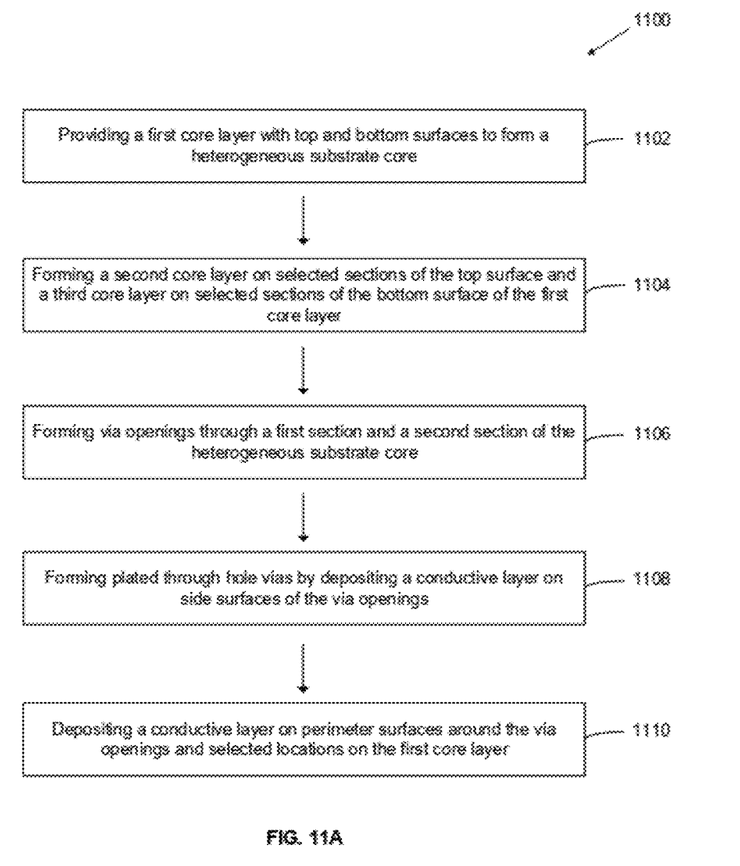
FIGS. 11A and 11B show a simplified flow diagram for aspects of an exemplary method according to the present disclosure.
Figure 11B:
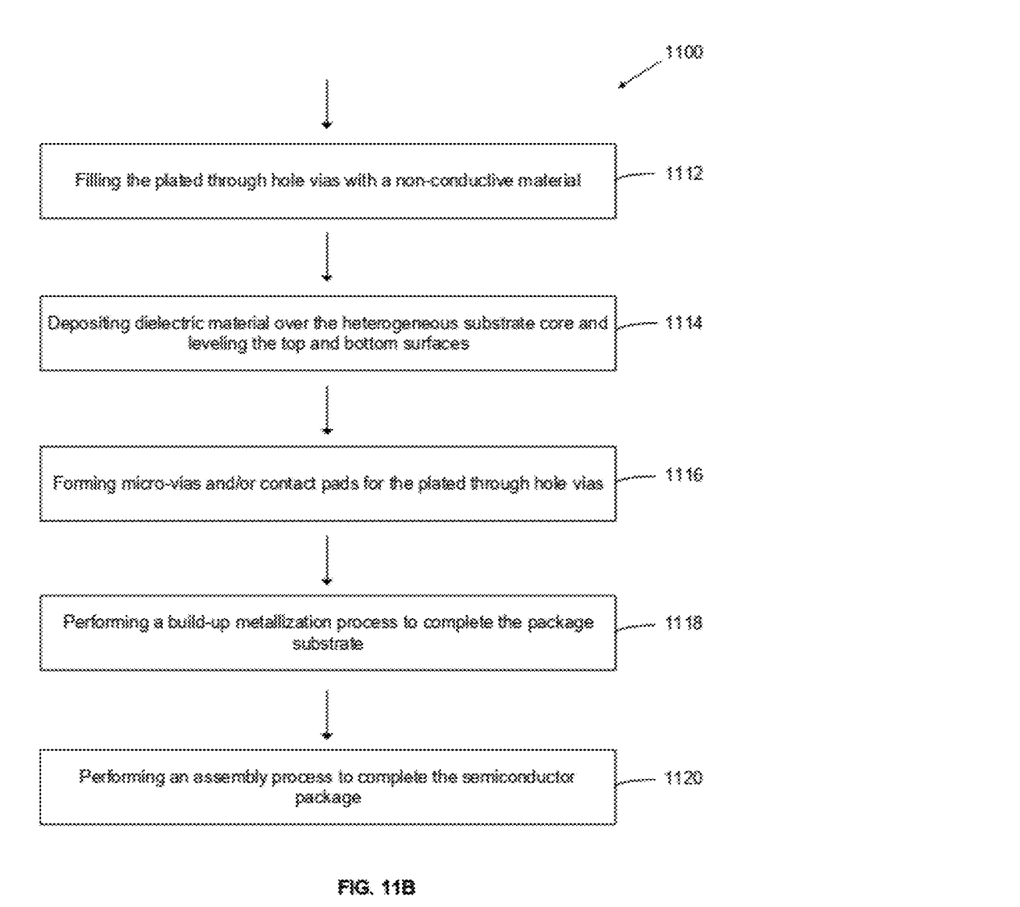

FIGS. 11A and 11B show a simplified flow diagram for an exemplary method for assembling a semiconductor package 1100 according to aspects of the present disclosure.

The operation 1102 may be directed to providing a first core layer with top and bottom surfaces for use to form a heterogeneous substrate core.

The operation 1104 may be directed to forming a second core layer on selected sections of the top surface and a third core layer on selected sections of the bottom surface of the first core layer.

The operation 1106 may be directed to forming via openings, including plated through hole via openings, through a first section and a second section of the heterogeneous substrate core.

The operation 1108 may be directed to forming plated through hole vias by depositing a conductive layer on the side surfaces of the via openings.

The operation 1110 may be directed to depositing a conductive layer on perimeter surfaces around the via openings and selected locations on the first core layer.

The operation 1112 may be directed to filling the plated through hole vias with a non-conductive material.

The operation 1114 may be directed to depositing a dielectric material over the heterogeneous substrate core and leveling the top and bottom surfaces of the partially completed package substrate.

The operation 1116 may be directed to forming micro-vias and/or contact pads for the plated through hole vias.

The operation 1118 may be directed to performing a build-up metallization process to complete the package substrate.

The operation 1120 may be directed to performing an assembly process to complete the semiconductor package.

Figure 12:
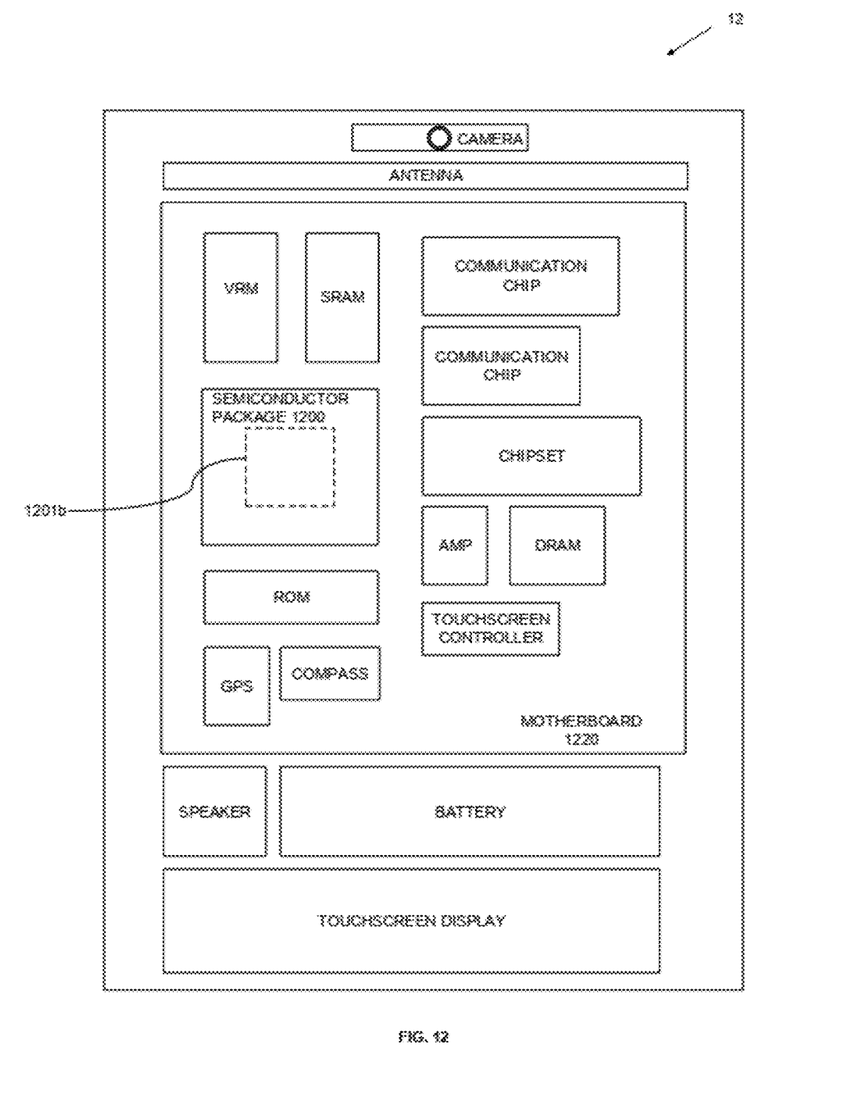
FIG. 12 shows an exemplary computing device according to an aspect of the present disclosure.

FIG. 12 shows an exemplary computing device 12 having a multi-chip semiconductor package 1200 with a heterogeneous substrate core (not shown) having a first core layer 1201b (shown as dashed lines) within the package according to various aspects of the present disclosure. In various implementations, the computing device 12 may be a laptop, a netbook, a notebook, an ultrabook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, or a digital video recorder. In an aspect, the computing device 12 may be a mobile computing device. In further implementations, the computing device 12 may be any other electronic device that processes data.

In a further aspect, the computing device 12 may have a board, such as a motherboard 1220, having several components, including, but not limited to, a semiconductor package 1200 that may or may not be physically and electrically coupled to such motherboard 1220. The other components may include, but are not limited to, volatile memory (e.g., DRAM), non-volatile memory (e.g., ROM), flash memory, a graphics processor, a digital signal processor, a crypto-processor, a communication chip, a chipset, an antenna, a display, a touchscreen controller, a battery, an audio codec, a video codec, a power amplifier, a global positioning system (GPS) device, a compass, a Geiger counter, an accelerometer, a gyroscope, a speaker, a camera, and a mass storage device (such as hard disk drive, compact disk (CD), digital versatile disk (DVD), and so forth). It is within the scope of the present disclosure to use, for example, a multi-chip semiconductor package with a heterogeneous substrate core within the package in other components set forth above.

According to the present disclosure, the computing device 12, using a multi-chip semiconductor package 1200 with a heterogeneous substrate core within the package, may include a plurality of communication chips. The communication chips may also operate in accordance with a Global System for Mobile Communication (GSM), General Packet Radio Service (GPRS), Universal Mobile Telecommunications System (UMTS), High-Speed Packet Access (HSPA), Evolved HSPA (E-HSPA), or LTE network. The communication chip may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chips may operate in accordance with Code Division Multiple Access (CDMA), Time Division Multiple Access (TDMA), Digital Enhanced Cordless Telecommunications (DECT), Evolution-Data Optimized (EV-DO), derivatives thereof, as well as any other wireless protocols that are designated as 3G, 4G, 5G, and beyond. The communication chip may operate in accordance with other wireless protocols in other aspects. For instance, a first communication chip may be dedicated to shorter range wireless communications such as Wi-Fi and Bluetooth and a second communication chip may be dedicated to longer range wireless communications such as GPS, EDGE, GPRS, CDMA, WiMAX, LTE, Ev-DO, and others.

In another aspect, the communication chip may enable wireless communications for the transfer of data to and from the computing device 12. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some aspects they might not.

The communication chip may implement any of several wireless standards or protocols, including but not limited to Institute for Electrical and Electronics Engineers (IEEE) standards including Wi-Fi (IEEE 502.11 family), IEEE 502.16 standards (e.g., IEEE 502.16-2005 Amendment), Long-Term Evolution (LTE) project along with any amendments, updates, and/or revisions (e.g., advanced LTE project, ultra-mobile broadband (UMB) project (also referred to as "3GPP2"), etc.). IEEE 502.16 compatible BWA networks are generally referred to as WiMAX networks, an acronym that stands for Worldwide Interoperability for Microwave Access, which is a certification mark for products that pass conformity and interoperability tests for the IEEE 502.16 standards.

To more readily understand and put into practical effect the present method and device for, particular aspects will now be described by way of examples. For the sake of brevity, duplicate descriptions of features and properties may be omitted.

EXAMPLES

Example 1 may include a package substrate including a heterogeneous substrate core in the package substrate, the heterogeneous substrate core including a first core layer including a top surface and a bottom surface, wherein the first core layer is coextensive with the package substrate, a first core section adjacent to a second core section, wherein the first core section is thicker than the second core section and wherein the first core layer extends through the first and second core sections of the heterogeneous substrate core, and at least one plated through hole via in the heterogeneous substrate core, and a plurality of level interconnects and micro-vias in the package substrate.

Example 2 may include the package substrate of example 1 and/or any other example disclosed herein, in which the heterogeneous substrate core further includes the first core section positioned along a periphery of the package substrate and at least partially framing the second core section.

Example 3 may include the package substrate of example 2 and/or any other example disclosed herein, in which the heterogeneous substrate core further includes an additional first core section positioned to bisect the second core section.

Example 4 may include the package substrate of example 1 and/or any other example disclosed herein, in which the heterogeneous substrate core further includes the second core section positioned along a periphery of the package substrate and at least partially framing the first core section.

Example 5 may include the package substrate of example 1 and/or any other example disclosed herein, further including a second core layer in the first core section positioned on the top surface of the first core layer.

Example 6 may include the package substrate of example 5 and/or any other example disclosed herein, further including the first and second core layers being integrally connected.

Example 7 may include the package substrate of example 1 and/or any other example disclosed herein, further including a second core layer in the first core section positioned on the top surface of the first core layer, and a third core layer in the first core section positioned on the bottom surface of the first core layer.

Example 8 may include the package substrate of example 7 and/or any other example disclosed herein, further including the first, second, and third core layers being integrally connected.

Example 9 may include the package substrate of example 7 and/or any other example disclosed herein, further including the second core layer and the third core layer having the same dimensions.

Example 10 may include the package substrate of example 7 and/or any other example disclosed herein, further including the second core layer and the third core layer having at least one or more difference in their respective length, width and/or height dimensions.

Example 11 may include the package substrate of example 10 and/or any other example disclosed herein, further including the second core layer including an outer second layer side edge and an inner second layer side edge, and the third core layer including an outer third layer side edge and an inner third layer side edge, wherein the outer second layer side edge and the outer third layer side edge are vertically aligned and the inner second layer side edge and the inner third layer side edge are vertically aligned, or wherein the outer second layer side edge and the outer third layer side edge are vertically aligned and the inner second layer side edge and the inner third layer side edge are not vertically aligned, or wherein the outer second layer side edge and the outer third layer side edge are not vertically aligned and the inner second layer side edge and the inner third layer side edge are not vertically aligned.

Example 12 may include the package substrate of example 1 and/or any other example disclosed herein, in which the at least one plated through hole via further includes a plurality of plated through hole vias positioned only in the second core section of the heterogeneous substrate core.

Example 13 may include a computing device including a printed circuit board, a semiconductor package on the printed circuit board, the semiconductor package including a package substrate, the package substrate including a heterogeneous substrate core in the package substrate, the heterogeneous substrate core including a first core section adjacent to a second core section, wherein the first core section is thicker than the second core section, a first core layer including a top surface and a bottom surface in the heterogeneous substrate core, wherein the first core layer is coextensive with the substrate and extends through the first and second core sections of the heterogeneous substrate core, and a plurality of plated through hole vias in the heterogeneous substrate core, and a plurality of level interconnects and micro-vias formed in the package substrate, and a plurality of semiconductor devices coupled to the package substrate.

Example 14 may include the computing device of example 13 and/or any other example disclosed herein, in which the first core section further includes a second core layer positioned on the top surface of the first core layer, or a third core layer positioned on the bottom surface of the first core layer, or a second core layer positioned on the top surface of the first core layer and a third core layer positioned on the bottom surface of the first core layer.

Example 15 may include the computing device of example 13 and/or any other example disclosed herein, in which the second core section further includes a recess in the top surface of the first core layer, or a recess in the bottom surface of the first core layer, or a first recess in the top surface of the first core layer and a second recess in the bottom surface of the first core layer.

Example 16 may include the computing device of example 13 and/or any other example disclosed herein, in which the semiconductor package further includes a stiffener on the package substrate.

Example 17 may include a method including forming a heterogeneous substrate core for a package substrate, wherein the forming of the heterogeneous substrate core further includes providing a first core layer with a top surface and a bottom surface that is coextensive with the package substrate, and forming a first and second core sections in the heterogeneous substrate core, wherein the first core section is adjacent to and thicker than the second core section and wherein the first core layer extends through the first and second core sections.

Example 18 may include the method of example 17 and/or any other example disclosed herein, in which the forming the first core section further includes forming a second core layer in the first core section positioned on the top surface of the first core layer, or forming a third core layer in the first core section positioned on the bottom surface of the first core layer, or forming a second core layer in the first core section positioned on the top surface of the first core layer and forming a third core layer in the first core section positioned on the bottom surface of the first core layer.

Example 19 may include the method of example 17 and/or any other example disclosed herein, in which the forming the second core section further includes removing a portion of the first core layer to form a recess in the top surface, or removing a portion of the first core layer to form a recess in the bottom surface, or removing a first portion of the first core layer to form a first recess in the top surface and a second portion of the first core layer to form a second recess in the bottom surface.

Example 20 may include the method of example 17 and/or any other example disclosed herein, further including forming a plurality of plated through hole vias only in the second core section of the heterogeneous substrate core.

It will be understood that any property described herein for a specific device may also hold for any device described herein. It will also be understood that any property described herein for a specific method may hold for any of the methods described herein. Furthermore, it will be understood that for any device or method described herein, not necessarily all the components or operations described will be enclosed in the device or method, but only some (but not all) components or operations may be enclosed.

The term "comprising" shall be understood to have a broad meaning similar to the term "including" and will be understood to imply the inclusion of a stated integer or operation or group of integers or operations but not the exclusion of any other integer or operation or group of integers or operations. This definition also applies to variations on the term "comprising" such as "comprise" and "comprises".

The term "coupled" (or "connected") herein may be understood as electrically coupled or as mechanically coupled, e.g., attached or fixed or attached, or just in contact without any fixation, and it will be understood that both direct coupling or indirect coupling (in other words: coupling without direct contact) may be provided.

While the present disclosure has been particularly shown and described with reference to specific aspects, it should be understood by those skilled in the art that various changes in form and detail may be made therein without departing from the scope of the present disclosure as defined by the appended claims. The scope of the present disclosure is thus indicated by the appended claims and all changes which come within the meaning and range of equivalency of the claims are therefore intended to be embraced.

What is claimed is:

1. A package substrate comprising:
a heterogeneous substrate core in the package substrate, the heterogeneous substrate core comprising:
a first core layer comprising a top surface and a bottom surface, wherein the first core layer is coextensive with the package substrate;
a first core section adjacent to a second core section, wherein the first core section is thicker than the second core section and wherein the first core layer extends through the first and second core sections of the heterogeneous substrate core; and
at least one plated through hole via in the heterogeneous substrate core; and
a plurality of level interconnects and micro-vias in the package substrate.

2. The package substrate of claim 1, wherein the heterogeneous substrate core further comprises the first core section positioned along a periphery of the package substrate and at least partially framing the second core section.

3. The package substrate of claim 2, wherein the heterogeneous substrate core further comprises an additional first core section positioned to bisect the second core section.

4. The package substrate of claim 1, wherein the heterogeneous substrate core further comprises the second core section positioned along a periphery of the package substrate and at least partially framing the first core section.

5. The package substrate of claim 1, further comprising a second core layer in the first core section positioned on the top surface of the first core layer.

6. The package substrate of claim 5, further comprising the first and second core layers being integrally connected.

7. The package substrate of claim 1, further comprising:
a second core layer in the first core section positioned on the top surface of the first core layer; and
a third core layer in the first core section positioned on the bottom surface of the first core layer.

8. The package substrate of claim 7, further comprising the first, second, and third core layers being integrally connected.

9. The package substrate of claim 7, further comprising the second core layer and the third core layer having the same dimensions.

10. The package substrate of claim 7, further comprising the second core layer and the third core layer having at least one or more difference in their respective length, width and/or height dimensions.

11. The package substrate of claim 10, further comprising:
the second core layer comprising an outer second layer side edge and an inner second layer side edge; and
the third core layer comprising an outer third layer side edge and an inner third layer side edge,
wherein the outer second layer side edge and the outer third layer side edge are vertically aligned and the inner second layer side edge and the inner third layer side edge are vertically aligned, or
wherein the outer second layer side edge and the outer third layer side edge are vertically aligned and the inner second layer side edge and the inner third layer side edge are not vertically aligned, or
wherein the outer second layer side edge and the outer third layer side edge are not vertically aligned and the inner second layer side edge and the inner third layer side edge are not vertically aligned.

12. The package substrate of claim 1, wherein the at least one plated through hole via further comprises a plurality of plated through hole vias positioned only in the second core section of the heterogeneous substrate core.

13. A computing device comprising:
a printed circuit board;
a semiconductor package on the printed circuit board, the semiconductor package comprising:
a package substrate, the package substrate comprising:
a heterogeneous substrate core in the package substrate, the heterogeneous substrate core comprising:
a first core section adjacent to a second core section, wherein the first core section is thicker than the second core section;
a first core layer comprising a top surface and a bottom surface in the heterogeneous substrate core, wherein the first core layer is coextensive with the substrate and extends through the first and second core sections of the heterogeneous substrate core; and
a plurality of plated through hole vias in the heterogeneous substrate core; and
a plurality of level interconnects and micro-vias formed in the package substrate; and
a plurality of semiconductor devices coupled to the package substrate.

14. The computing device of claim 13, wherein the first core section further comprises:
a second core layer positioned on the top surface of the first core layer; or
a third core layer positioned on the bottom surface of the first core layer; or
a second core layer positioned on the top surface of the first core layer and a third core layer positioned on the bottom surface of the first core layer.

15. The computing device of claim 13, wherein the second core section further comprises:
a recess in the top surface of the first core layer; or
a recess in the bottom surface of the first core layer; or
a first recess in the top surface of the first core layer and a second recess in the bottom surface of the first core layer.

16. The computing device of claim 13, wherein the semiconductor package further comprises a stiffener on the package substrate.

* * * * *